Figure 1:
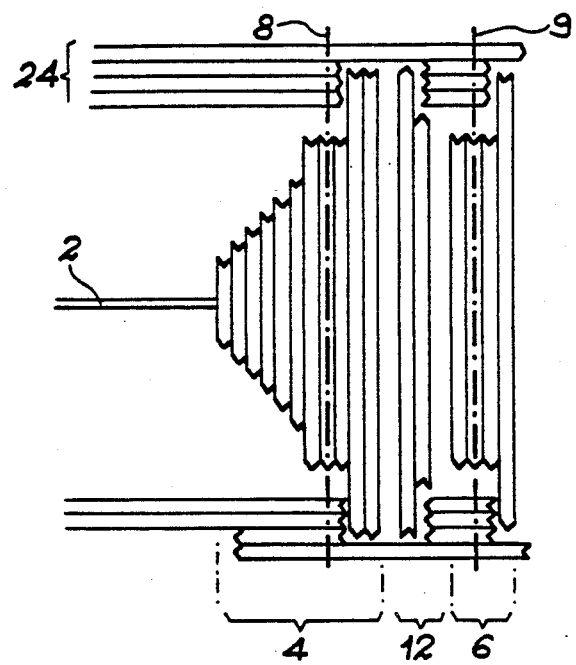

United States Patent [19]

Fedeli et al.

[11] Patent Number: 4,912,673

[45] Date of Patent: Mar. 27, 1990

[54] DETECTION SYSTEM FOR A MAGNETIC BUBBLE MEMORY IN HYBRID TECHNOLOGY

[75] Inventors: Jean-Marc Fedeli, Le Fontanil; Joël Magnin, Saint Martin d'Heres; Marie-Thérèse Delaye; Marc Rabarot, both of Grenoble, all of France

[73] Assignee: Commissariat a l'Energie Atomique, Paris, France

[21] Appl. No.: 292,301

[22] Filed: Dec. 30, 1988

[30] Foreign Application Priority Data

Jan. 5, 1988 [FR] France .............................. 88 00032

[51] Int. Cl.$^4$ .............................................. G11C 19/08
[52] U.S. Cl. .......................................... 365/8; 365/36; 365/43
[58] Field of Search ............................... 365/8, 36, 43

[56] References Cited

U.S. PATENT DOCUMENTS

| | | | |
|---|---|---|---|
| 4,229,806 | 10/1980 | Josephs | 365/8 |
| 4,300,209 | 11/1981 | Washburn | 365/8 |
| 4,323,983 | 4/1982 | Lee | 365/8 |

Primary Examiner—James W. Moffitt
Attorney, Agent, or Firm—Oblon, Spivak, McClelland, Maier & Neustadt

[57] ABSTRACT

Magnetic bubble memory in hybrid technology using rows of chevron patterns. The memory detection system has an active detection zone (4) constituted by rows of chevrons, in order to stretch into the form of a strip the bubbles from a propagation path (2), and a first detector (8); a bubble elimination zone (12) constituted by forcing back means (18) for stopping the advance of the bubbles and for forcing them outside the detection system; and a passive detection zone (6) located following the bubble elimination zone (12) and incorporating a second detector (9), to which no bubble must be exposed, in order to eliminate the unwanted signal due to the influence of a rotary magnetic field necessary for the propagation of the bubbles. According to the invention, elimination zone (12) is provided with at least one barrier (20) produced by ion implantation in order to block the passage of the bubbles from active zone (4) to passive zone (6). The barrier or barriers (20, 22, 26, 28, 30) can be constituted by a high energy implantation of $H_2^+$ ions.

8 Claims, 2 Drawing Sheets

DETECTION SYSTEM FOR A MAGNETIC BUBBLE MEMORY IN HYBRID TECHNOLOGY

DESCRIPTION

Within the field of magnetic bubble memories in hybrid technology, the invention relates to the detection of magnetic bubbles in a detection means using rows of chevrons and constituted by an active detection zone and a passive detection zone.

In a magnetic bubble memory, the bubbles are contained in a monocrystalline magnetic layer, supported by an magnetic monocrystalline garnet. These bubbles are in the form of generally cylindrical, isolated magnetic domains and have a magnetization which is the reverse of that of the remainder of the monocrystalline magnetic layer.

By applying a continuous magnetic field perpendicular to the plane of the magnetic layer, the magnetic bubbles are stable. In practice, this magnetic field can be created by a permanent magnet, thus ensuring the non-volatility of the information contained in the bubble memory. By also applying a continuous rotary magnetic field in a plane parallel to the surface of the magnetic layer, it is possible to bring about the displacement of the bubbles, which takes place around propagation patterns. These patterns can be made from an iron and nickel based material called permalloy and can be deposited on an isolating layer covering the magnetic layer. These patterns can be chevrons. Permalloy is an alloy of nickel (approximately 80%) and iron (approximately 20%). It is characterized by its high magnetic permeability (approximately 50 times that of pure iron in weak magnetic fields). These patterns can also be obtained by implanting ions in the upper part of the magnetic layer through a mask making it possible to define their shape.

The displacement of the bubbles along these patterns generally takes place for a time equal to one third of the rotation period of the rotary magnetic field, the bubbles remaining stationary in the spaces defined between two adjacent patterns during the remainder of the cycle. In this way shift registers are formed, in which the binary information "1" is represented by the presence of a bubble and the binary information "0" by the absence of a bubble.

The output of a bubble memory is constituted by a propagation path leading to a detection means, which is used for reading the memory. A magnetic bubble detection means is formed by an active detection zone and a passive detection zone.

With reference to FIG. 1, the propagation path 2 constituted by a succession of patterns similar to chevrons leads the bubbles containing the information to be read to the active zone 4. The latter is formed by rows of patterns, e.g. of the type successively containing a rising number of patterns. Each magnetic bubble arriving in this active zone 4 is therefore drawn out or stretched into the shape of a band or strip under the action of these rows of chevrons. It is propagated in this form up to a detector 8 located over the entire width of the active zone. The magnetic bubble in said strip form influences the detector 8 and makes it possible to obtain a detection signal. The detected signal is the sum of the signal produced by the stretched strip and the unwanted signal induced by the rotary field. Detector 8 is formed by a magnetoresistive bar inserted between the magnetic layer containing the bubbles and the chevrons.

In order to eliminate this unwanted signal, with the active detector 8 is associated an identical passive detector 9, which may only be influenced by the rotary field. For this purpose, the passive detection zone 6 containing it must be free from any bubble or strip (stretched bubble). Thus, by differential amplification of the signal from the active detector 8 and the signal from the passive detector 9, elimination takes place of the unwanted signal induced by the rotary field and all that is obtained is the signal induced by the magnetic bubbles.

To prevent the magnetic bubbles and more particularly the stretched bubbles in the active zone 4 from penetrating the passive zone 6, bubble elimination zones 12, 13, 24 are provided around the passive zone 6 and in particular between the active and passive zones.

These elimination zones can have confinement zones, forcing back zones and spaces, the latter making it possible to prevent the possible attachment of the bubbles or strips propagating in the passive or active zone to the forcing back zones.

FIG. 1 shows the passive detection zone 6 and the bubble elimination zone 12 following the active detection zone with respect to the propagation path 2, but obviously the passive detection zone 6 can be located at any point in the detection system, provided that the axis of detector 9 is always parallel to the axis of the active detector, so that the signal due to the rotary magnetic field is the same for the active and passive detectors.

Figure 2:
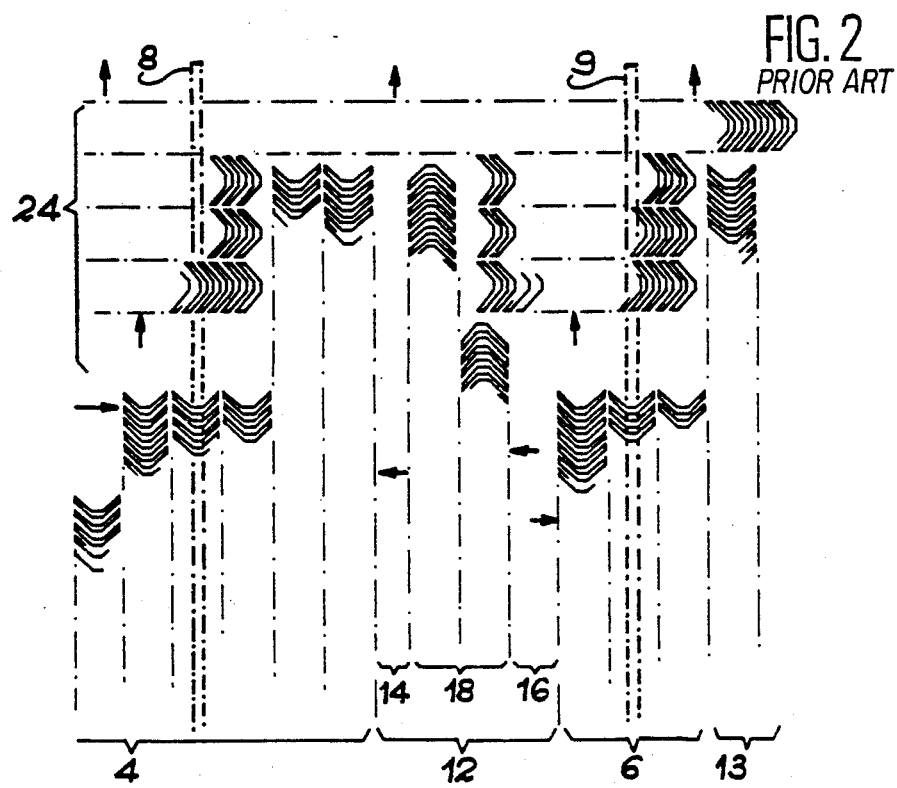

In the larger scale view of a preferred embodiment shown in FIG. 2, a confinement zone 14 is shown, which borders the active zone 4. A forcing back 18 is provided between the confinement zone 14 and a space 16 bordering the passive zone 6. These zones 14, 16, 18 constitute the elimination zone 12 located between the passive and active zones. This forcing back zone 18 is constituted by one or more rows of chevrons oriented in a direction opposite to the orientation of the chevrons of the active zone 4 and the passive zone 6 with a view to forming an obstacle to the possible passage of magnetic bubbles towards the passive zone 6. The stretched magnetic bubbles detected in active zone 4 are either completely disintegrated in the confinement zone 14, or, still in the form of bubbles, pass out of the confinement zone 14 to the outside of the detection system. The latter is assisted by a lateral forcing back zone 24, placed on either side of the active and passive zones and whose chevrons are oriented in a direction perpendicular to the orientation direction of the chevrons in the active zone 4 and passive zone 6. Thus, the magnetic zones are forced back from the interior to the exterior of the active and passive zones.

Moreover, an elimination zone 13 constituted by a forcing back zone is located behind the passive detection zone.

The effectiveness of the elimination zones 12, 13, 24 for the magnetic bubbles is not adequate, because certain parasitic bubbles enter the passive zone 6 despite the forcing back zone 18 and space 16 and are detected by the second passive detector 9. This falsifies the result from the combination of the signals of active detector 8 and passive detector 9.

The aim of the invention is to increase the effectiveness of the elimination zones and particularly zone 12, in order to improve the protection of passive zone 6.

Therefore the main object of the invention is a magnetic bubble memory in hybrid technology using rows of chevron patterns and whereof the detection system incorporates:

an active zone constituted by rows of chevrons oriented in a first given direction for stretching into the form of a strip bubbles from a propagation path and a first magnetoresistive detector to which each stretched bubble is exposed;

a passive zone located in the vicinity of the active zone and constituted by rows of chevrons oriented in the first direction and a second magnetoresistive detector, to which each bubble must not be exposed, with a view to eliminating the unwanted signal due to the influence of a rotary magnetic field necessary for the propagation of the bubbles; and a group of bubble elimination zones making it possible to force back the bubbles outside the detection system, said zones entirely surrounding the passive zone and partly surrounding the active zone.

According to the invention, said group of elimination zones is provided with at least one barrier produced by ion implantation, in order to block the passage of the bubbles towards the passive zone, said barrier being located in front of the passive zone. Thus, only the rotary magnetic field influences the passive detector. The signals from the passive and active detectors are combined, so only the unwanted signal due to the rotary magnetic field will be completely eliminated from the signals supplied by the detection system.

According to the invention and in a preferred manner, the barrier is perpendicular to the propagation direction of the bubbles in the active zone. It is advantageous for said barrier to extend over the entire width of the detection system when the passive zone is placed behind the active zone, in such a way that the ends of the barrier are located in the lateral elimination zones.

The detection system has lateral elimination zones constituted by rows of chevrons oriented in a direction perpendicular to the orientation direction of the chevrons in the active zone and such that they make it possible to discharge the bubbles. According to the invention at least one first supplementary barrier is located in the lateral elimination zones perpendicular to the bubble discharge direction, in order to prevent the passage of bubbles into the interior of the passive zone.

A second supplementary barrier is also located on the border of the active zone of the detection system in the lateral elimination zones, in order to prevent the intrusion of parasitic bubbles from the outside of the detection system into the active zone.

According to a special embodiment of the invention, the barrier or barriers are constituted by an ion implantation. These implanted ions are preferably hydrogen ions and are implanted in the magnetic layer containing the bubbles.

The invention is described in greater detail hereinafter relative to non-limitative embodiments and with reference to the attached drawings, wherein show:

FIG. 1, already described, a diagram of an exemplified structure of a prior art bubble memory detection means.

FIG. 2 a partial larger scale view of FIG. 1.

Figure 3:
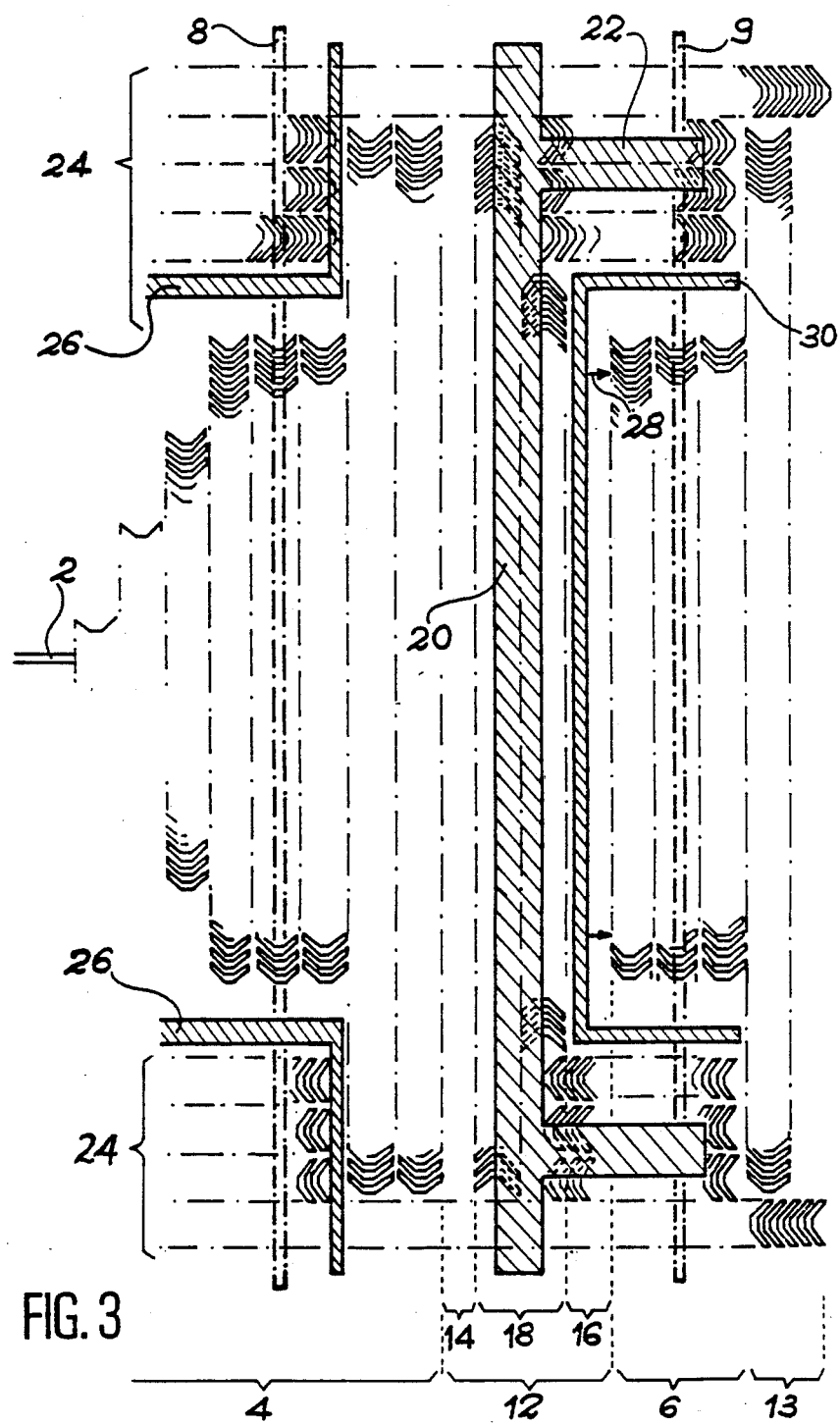

FIG. 3 diagrammatically an embodiment of a bubble memory detection system according to the invention.

The structure of a prior art bubble memory detection means shown in FIG. 1 has the following main elements. A propagation path 2 gives the magnetic bubbles access to an active detection zone 4. The latter is e.g. followed by a magnetic bubble elimination zone 12 and a passive detection zone 6. The active 4 and passive 6 detection zones and the propagation path 2 are constituted by permalloy patterns, which can be likened to chevrons and which are aligned so as to constitute rows forming displacement paths for the magnetic bubbles.

As shown in FIG. 3, the structure of a bubble memory according to the invention adopts the prior art bubble memory structure described hereinbefore. There are two active 4 and passive 6 detection zones, as well as their respective detectors 8, 9, and the magnetic bubble elimination zone system 12 separating the two detection zones 4 and 6.

According to the invention and to increase the efficiency of said elimination zone system, use is made of a barrier 20 located in the forcing back zone 18 of said elimination zone system 12. This barrier is produced by ion implantation and constitutes a wall which prevents any passage of magnetic bubbles, more particularly from active zone 4 to passive zone 6. On the edges of the pattern, produced by ion implantation and which form the said barrier, are obtained magnetic field wells, which trap the bubbles and block their passage from one zone to the other under normal operating conditions. This barrier is oriented perpendicular to the propagation direction of bubbles in active zone 4. It can extend over the entire width of the detection system.

The detection system has in general terms on each of its sides, a lateral elimination zone 24 formed by rows of chevrons oriented in a direction perpendicular to the orientation direction of the chevrons in the active zone 4 and such that they make it possible to discharge the bubbles. To prevent certain bubbles from penetrating the passive zone level with said lateral zone 24, barrier 20 is completed by a first supplementary barrier 22 located in the vicinity of the passive zone in lateral zones 24 perpendicular to the bubble discharge direction in said zones.

In order to improve the efficiency of the system, it is also possible to add a second supplementary barrier 26 on the border of active zone 4, to prevent the intrusion of parasitic bubbles from the outside of the detection system into the active zone and more specifically between the lateral forcing back zones and the active zone.

A second main barrier 28 is shown and duplicates the first main barrier 20 and is located in space 16. It can also be completed by a part 30 perpendicular to the direction of the main part of said second barrier and located between the lateral forcing back zones and the passive zone.

These different barriers make is possible to improve the operating margins of the apparatus, whilst preventing any signal from the passive detector.

The different barriers provided in the apparatus according to the invention are constituted by an ion implantation carried out prior to constituting the active and passive detection zones and particularly before the detectors and rows of chevrons. These ions are preferably hydrogen $H_2^+$ ions implanted by ion bombardment with a dose of approximately $4.10^{16}$ atoms per $cm^3$ and an energy of 80 KeV. Implantation takes place with the aid of a mask which, during implantation, covers those parts of the magnetic layer to be free from any implantation. On the border of these zones, a stress profile is obtained due to the increase in the crystal lattice in the implanted zones. A magnetic potential barrier is then obtained. The bubbles are positioned on the border of the implanted zones, which constitute energy wells. In the absence of any exceptional magnetic variation, the passage of magnetic bubbles from one zone to the other is impossible.

We claim:

1. Magnetic bubble memory in hybrid technology using rows of chevron patterns and whereof the detection system incorporates:
   an active zone constituted by rows of chevrons oriented in a first given direction for stretching into the form of a strip bubbles from a propagation path and a first magnetoresistive detector to which each stretched bubble is exposed;
   a passive zone located near to the active zone and constituted by rows of chevrons oriented in the first direction and a second magnetoresistive detector, to which each bubble must not be exposed, with a view to eliminating the unwanted signal due to the influence of a rotary magnetic field necessary for the propagation of the bubbles; and
   a group of bubble elimination zones making it possible for force back the bubbles outside the detection system, said zones entirely surrounding the passive zone and partly surrounding the active zone;
   characterized in that the group of elimination zones is provided with at least one barrier produced by ion implantation in order to block the passage of bubbles to the passive zone, said barrier being located in front of the passive zone.

2. Memory according to claim 1, characterized in that said barrier is perpendicular to the bubble propagation direction in the active zone.

3. Memory according to claim 1, characterized in that the said barrier extends over the entire width of the detection system.

4. Memory according to claim 1, whereof the detection system has lateral elimination zones constituted by rows of chevrons oriented in a direction perpendicular to the orientation direction of the chevrons in the active zone in order to discharge the bubbles, characterized in that at least one first supplementary barrier is located in the lateral elimination zones perpendicular to the bubble discharge direction, in order to prevent the passage of bubbles towards the inside of the passive zone.

5. Memory according to claim 1, characterized in that at least one second supplementary barrier is provided on the border of the active zone of the detection system, in the lateral elimination zones, to prevent the intrusion of parasitic bubbles from the outside into the active zone.

6. Memory according to claim 1, characterized in that the barrier or barriers are constituted by an ion implantation.

7. Memory according to claim 6, characterized in that the implanted ions are hydrogen ions ($H_2^+$) implanted in a magnetic layer containing bubbles.

8. Magnetic bubble memory in hybrid technology using rows of chevron patterns and whereof the detection system incorporates:
   an active zone constituted by rows of chevrons oriented in a first given direction for stretching into the form of a strip bubbles from a propagation path and a first magnetoresistive detector to which each stretched bubble is exposed;
   a passive zone located near to the active zone and constituted by rows of chevrons oriented in the first direction and a second magnetoresistive detector, to which each bubble must not be exposed, with a view to eliminating the unwanted signal due to the influence of a rotary magnetic field necessary for the propagation of the bubbles; and
   a group of bubble elimination zones making it possible to force back the bubbles outside the detection system, said zones entirely surrounding the passive zone and partly surrounding the active zone, and being provided with at least one barrier produced by ion implantation in order to block the passage of the bubbles towards the passive zone, said barrier being positioned in front of the passive zone and oriented in a direction perpendicular to the propagation direction of the bubbles in the active zone and extending over the entire width of the detection system;
   lateral elimination zones formed by rows of chevrons oriented in a direction perpendicular to the orientation direction of the chevrons in the active zone for discharging bubbles;
   a first supplementary barrier located in lateral elimination zones, perpendicular to the bubble discharge direction, to prevent the passage of bubbles towards the interior of the passive zone;
   a second supplementary barrier provided on the border of the active zone of the detection system, in the lateral elimination zones, in order to prevent the intrusion of parasitic bubbles from the exterior into the active zones, all the barriers being constituted by an implantation of hydrogen ($H_2^+$) ions, implanted in the magnetic layer containing the bubbles.

* * * * *